(12) United States Patent
Kim et al.

(10) Patent No.: US 12,282,249 B2
(45) Date of Patent: Apr. 22, 2025

(54) FULL-CHIP CELL CRITICAL DIMENSION CORRECTION METHOD AND METHOD OF MANUFACTURING MASK USING THE SAME

(71) Applicant: Samsung Electronics Co., Ltd., Suwon-si (KR)

(72) Inventors: Kisung Kim, Seoul (KR); Donggon Woo, Yongin-si (KR); Heejun Lee, Seoul (KR); Dongho Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 483 days.

(21) Appl. No.: 17/859,288

(22) Filed: Jul. 7, 2022

(65) Prior Publication Data

US 2023/0168576 A1 Jun. 1, 2023

(30) Foreign Application Priority Data

Nov. 30, 2021 (KR) ........................ 10-2021-0169336

(51) Int. Cl.
*G03F 1/36* (2012.01)
*G03F 1/70* (2012.01)
*G03F 7/00* (2006.01)

(52) U.S. Cl.
CPC .................. *G03F 1/36* (2013.01); *G03F 1/70* (2013.01); *G03F 7/705* (2013.01); *G03F 7/70508* (2013.01); *G03F 7/70625* (2013.01)

(58) Field of Classification Search
CPC ... G03F 1/36; G03F 1/70; G03F 7/705; G03F 7/70508; G03F 7/70625; G03F 7/70441; G03F 1/22
See application file for complete search history.

(56) References Cited

U.S. PATENT DOCUMENTS

| | | | |
|---|---|---|---|
| 8,601,406 B2 * | 12/2013 | Bang | G03F 1/36 716/139 |
| 9,116,438 B2 | 8/2015 | Lee et al. | |
| 10,431,423 B2 | 10/2019 | Lin et al. | |
| 10,620,547 B2 | 4/2020 | Moon et al. | |
| 10,811,225 B2 | 10/2020 | Lin et al. | |
| 10,963,614 B2 | 3/2021 | Kim et al. | |

(Continued)

FOREIGN PATENT DOCUMENTS

KR 10-2009-0099404 A 9/2009
KR 10-2010-0025822 A 3/2010

*Primary Examiner* — Stacy Whitmore
(74) *Attorney, Agent, or Firm* — Harness, Dickey & Pierce, P.L.C.

(57) ABSTRACT

A full-chip cell critical dimension (CD) correction method and a method of manufacturing a mask by using the same are provided. The full-chip cell CD correction method includes receiving a database (DB) about a full-shot; analyzing a hierarchy of the DB; generating a density map of a full-chip by using the DB and converting the density map into a retarget rule table, the converting including mapping the density map by using a density rule; reconfiguring cell blocks of the full-chip into an optical proximity correction (OPC) target cell layout for OPC; applying a first bias to the OPC target cell layout, based on the retarget rule table; and generating an optical proximity corrected (OPC'ed) layout for the full-chip by performing hierarchical OPC.

20 Claims, 25 Drawing Sheets

(56) References Cited

U.S. PATENT DOCUMENTS

| | | | |
|---|---|---|---|
| 2009/0228860 A1* | 9/2009 | Okada | G03F 1/36 |
| | | | 716/50 |
| 2013/0275925 A1* | 10/2013 | Wang | G06F 30/39 |
| | | | 716/53 |
| 2017/0123327 A1* | 5/2017 | Jang | G03F 1/72 |
| 2018/0121594 A1* | 5/2018 | Studders | G06F 30/398 |

* cited by examiner

FIG. 2B
BCE
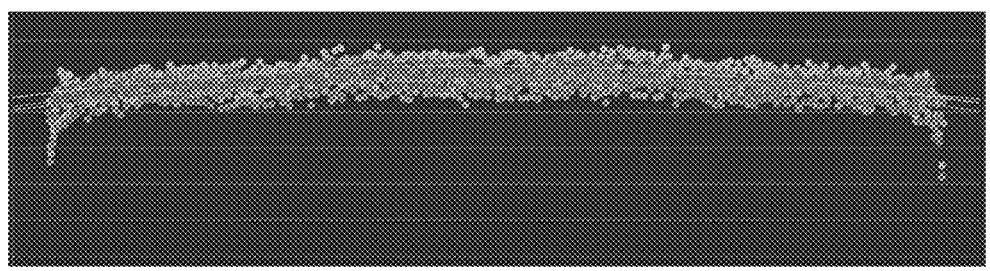
BEE
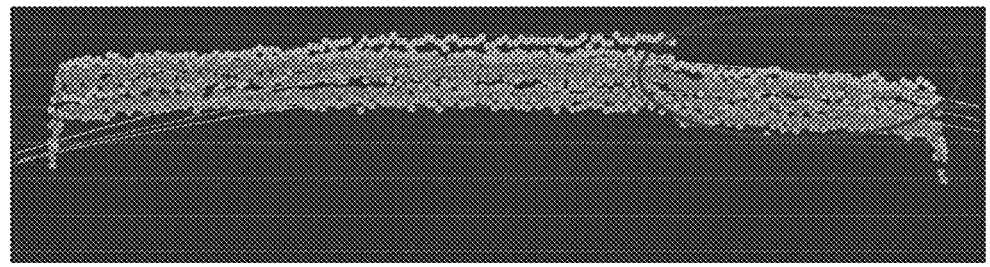

FIG. 2C
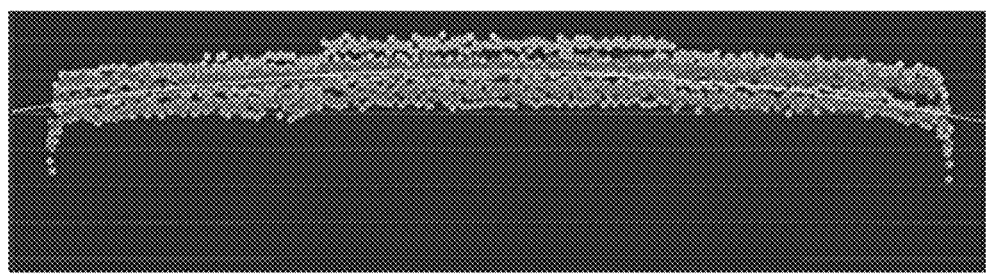
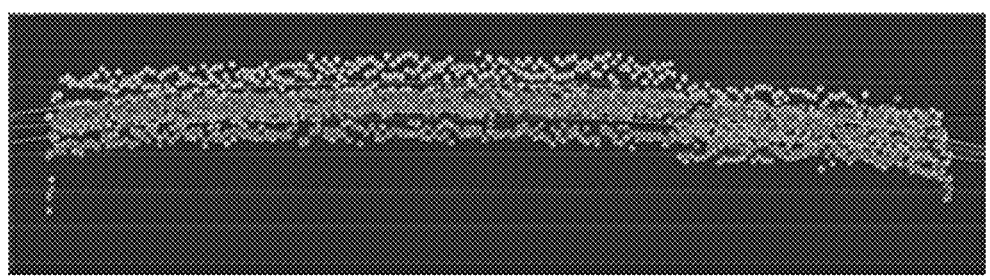
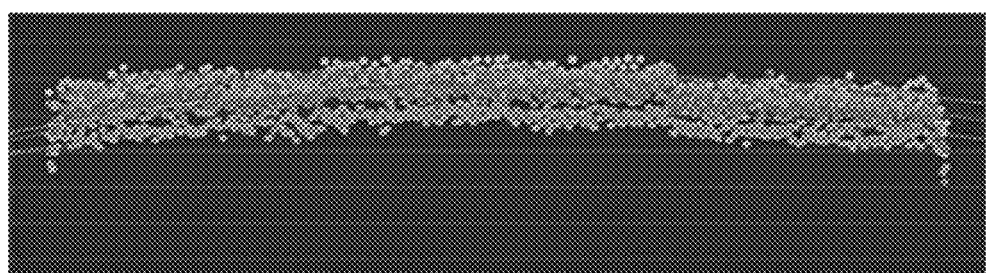

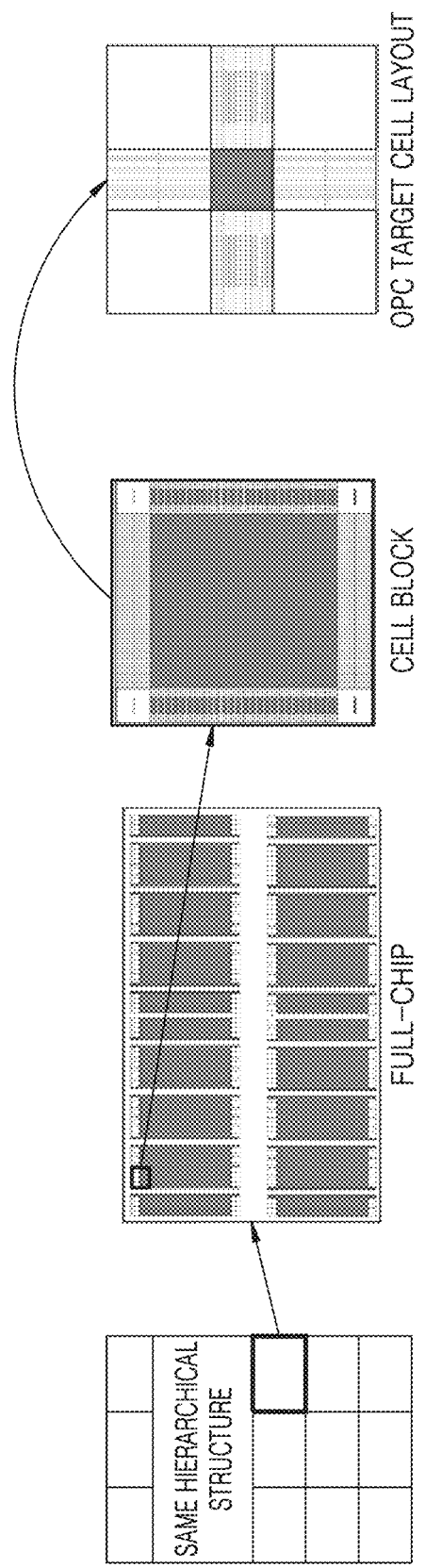

FIG. 6C

|  | $0 < X \leq 10$ | $10 < X \leq 50$ | $50 < X \leq 90$ | $90 < X \leq 150$ | $150 < X \leq 500$ | $500 < X$ |
|---|---|---|---|---|---|---|
| $0 < Y \leq 10$ | A | A | B | C | D | E |
| $10 < Y \leq 50$ | A | A | B | C | D | E |
| $50 < Y \leq 90$ | B | B | B | C | D | E |
| $90 < Y \leq 150$ | C | C | C | C | D | E |
| $150 < Y \leq 500$ | D | D | D | D | D | E |
| $500 < Y$ | E | E | E | E | E | E |

FULL-CHIP CELL CRITICAL DIMENSION CORRECTION METHOD AND METHOD OF MANUFACTURING MASK USING THE SAME

CROSS-REFERENCE TO RELATED APPLICATION

This application is based on and claims priority under 35 U.S.C. § 119 to Korean Patent Application No. 10-2021-0169336, filed on Nov. 30, 2021, in the Korean Intellectual Property Office, the disclosure of which is incorporated by reference herein in its entirety.

BACKGROUND

Inventive concepts relate to a method of manufacturing a mask, and more particularly, to a cell critical dimension (CD) correction method for a full-chip and/or a method of manufacturing a mask by using the cell CD correction method.

In a semiconductor process, photolithography using a mask may be performed to form a pattern in a semiconductor substrate, such as a wafer. A mask or a photomask may be simply defined as a pattern transfer artifact, in which a pattern is formed of an opaque material on a transparent base material, such as but not limited chrome on glass. In brief, in a mask manufacturing process, a desired circuit is planned, the layout of the desired circuit is designed, and mask design data obtained through optical proximity correction (OPC) is transmitted as mask tape-out (MTO) design data. Thereafter, mask data preparation (MDP) is performed based on the MTO design data, and a mask may be partially or completely manufactured by performing front-end-of-line (FEOL), such as an exposure process, and back-end-of-line (BEOL), such as defect inspection.

SUMMARY

Inventive concepts provide a method of effectively correcting a cell critical dimension (CD) error of a full-chip and/or a method of manufacturing a mask by using the same.

According to some example embodiments, there is provided a full-chip cell CD correction method including receiving a database (DB) about a full-shot; analyzing a hierarchy of the DB; generating a density map of a full-chip by using the DB and converting the density map into a retarget rule table, the converting including mapping the density map using a density rule such as a set density rule; reconfiguring cell blocks of the full-chip into an optical proximity correction (OPC) target cell layout; applying a first bias to the OPC target cell layout, based on the retarget rule table; and generating an optical proximity corrected (OPC'ed) layout for the full-chip by performing hierarchical OPC.

According to some example embodiments, there is provided a full-chip cell CD correction method including receiving a DB about a full-shot; analyzing a hierarchy of the DB; generating a density map of a full-chip by using the DB and converting the density map into a retarget rule table, the converting including mapping the density map using a density rule; reconfiguring cell blocks of the full-chip into an OPC target cell layout for OPC; applying a first bias to the OPC target cell layout, based on the retarget rule table; generating an OPC'ed cell layout by performing OPC on the OPC target cell layout having the first bias applied thereto; generating an OPC'ed cell block layout by configuring a cell block using the OPC'ed cell layout; and generating an OPC'ed full-chip layout by configuring the full-chip using the OPC'ed cell block layout.

According to some example embodiments, there is provided a method of manufacturing a mask. The method includes receiving a DB about a full-shot; analyzing a hierarchy of the DB; generating a density map of a full-chip by using the DB and converting the density map into a retarget rule table, the converting including by mapping the density map using a density rule; reconfiguring cell blocks of the full-chip into an OPC target cell layout for OPC; applying a first bias to the OPC target cell layout, based on the retarget rule table; generating an OPC'ed layout for the full-chip by performing hierarchical OPC; sending the OPC'ed layout for the full-chip as mask tape-out (MTO) design data; preparing mask data based on the MTO design data; and exposing a mask substrate based on the mask data.

According to some example embodiments, there is provided a method of manufacturing a mask. The method includes receiving a DB about a full-shot; analyzing a hierarchy of the DB; generating a density map of a full-chip by using the DB and converting the density map into a retarget rule table, the converting including mapping the density map using a density rule; reconfiguring cell blocks of the full-chip into an OPC target cell layout for OPC; applying a first bias to the OPC target cell layout, based on the retarget rule table; generating an OPC'ed cell layout by performing OPC on the OPC target cell layout having the first bias applied thereto; generating an OPC'ed cell block layout by configuring a cell block by using the OPC'ed cell layout; generating an OPC'ed full-chip layout by configuring the full-chip by using the OPC'ed cell block layout; sending the OPC'ed layout for the full-chip as MTO design data; preparing mask data based on the MTO design data; and exposing a mask substrate based on the mask data.

BRIEF DESCRIPTION OF THE DRAWINGS

Various example embodiments of inventive concepts will be more clearly understood from the following detailed description taken in conjunction with the accompanying drawings in which:

FIGS. 2A to 2C are respectively images of a density map of a full-chip, cell CD errors in a bank center edge (BCE) and a bank edge edge (BEE), and cell CD errors according to positions in a chip;

FIG. 3 is a conceptual diagram of an operation of analyzing the hierarchy of a DB in the full-chip cell CD correction method of FIG. 1;

FIGS. 6B and 6C show images respectively corresponding to the sub operations;

DETAILED DESCRIPTION OF VARIOUS EXAMPLE EMBODIMENTS

Figure 1:
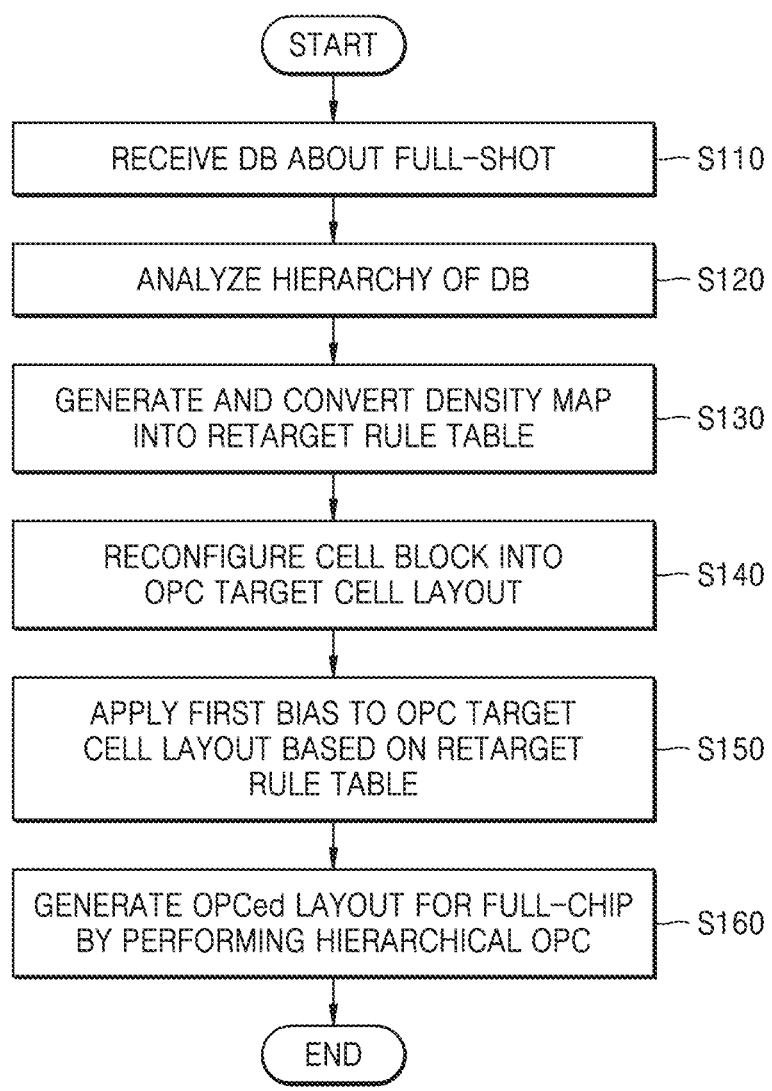
FIG. 1 is a schematic flowchart of a full-chip cell critical dimension (CD) correction method according to some example embodiments.

Hereinafter, various example embodiments will be described in detail with reference to the accompanying drawings. In the drawings, like reference characters denote like elements, and redundant descriptions thereof will be omitted.

FIG. 1 is a schematic flowchart of a full-chip cell critical dimension (CD) correction method according to some example embodiments Referring to FIG. 1, the full-chip cell CD correction method includes receiving a database (DB) about a full-shot, e.g. a full mask shot including a patterns for one or more dies arranged in a rectangular grid, along with surrounding scribe lines that surround the one or more die, in operation S110. Here, the full-shot may refer to a layout of patterns of an entire mask, which is transferred to a wafer by a single shot in an exposure during the manufacture of a semiconductor device. The DB may include data about the full-shot, e.g., the whole mask layout. A cell CD may refer to the CD of cell patterns in a cell block (such as a standard cell block and/or memory cell block), and may be distinguished from the CD of patterns in a peripheral or core region. Hereinafter, a cell CD and a CD may substantially have the same meaning, and a cell CD error and a CD error may substantially have the same meaning.

In more detail, a pattern on a substrate, such as but not limited to a wafer, may be formed by transferring a pattern on a mask to the substrate by using an exposure process. Accordingly, a mask layout, e.g., the layout of the pattern on the mask corresponding to the pattern on the substrate, may initially be designed. Due to the characteristics of an exposure process and/or an etch process, the shape of a pattern on a substrate may usually be different from the shape of a pattern on a mask. Because the pattern on a mask is projected and transferred in reduced size to a substrate, the size of the pattern on the mask may be greater than the size of a pattern on the substrate. A single mask corresponding to a full-shot may correspond to a plurality of chips or die on a wafer, along with surrounding scribe lines. However, a single mask may correspond to a single chip on a wafer in some example embodiments, along with surrounding scribe lines.

With the miniaturization of patterns, an optical proximity effect (OPE) may occur during an exposure process because of an influence between adjacent patterns, and optical proximity correction (OPC) may be performed to suppress or reduce the occurrence of an OPE through mask layout correction. The OPC may include generating an optical image of a pattern, generating an OPC model, and obtaining an image and/or data about a mask layout through a simulation by using the OPC model.

The OPC may broadly be classified into two kinds: a rule-based OPC; and a simulation-based or model-based OPC. The model-based OPC uses the results of measuring only representative patterns without measuring all of a large amount of test patterns, and may thus be advantageous in terms of time and/or cost. The OPC may include not only modifying a mask layout but also a method of adding sub-lithographic features called serifs on corners of a pattern, and/or a method of adding sub-resolution assist features (SRAFs), such as scattering bars and/or inriggers and/or outriggers.

For the OPC, basic data for the OPC is prepared. Here, the basic data may include one or more of data about shapes of patterns of a sample, positions of the patterns, types of measurements, such as measurements of spaces or lines of the patterns, and basic measurement values. The basic data may also include information such as one or more other physical properties such as a thickness, a refractive index, and a dielectric constant of photoresist (PR) and a source map for a shape of an illumination system. The basic data is not limited to those described above.

After the basic data is prepared, an optical OPC model may be generated. The generation of the optical OPC model may include optimizing or improving a defocus stand (DS) position and a best focus (BF) position in an exposure process. The generation of the optical OPC model may also include generating an optical image considering diffraction of light or an optical state of exposure equipment. The generation of the optical OPC model is not limited to those described above. For example, the generation of the optical OPC model may include various contents related to optical phenomena in the exposure process.

After the optical OPC model is generated, an OPC model for PR may be generated. The generation of the OPC model for PR may include optimizing or improving a threshold value of the PR. Here, the threshold value of the PR may refer to a threshold value at which a chemical change occurs during an exposure process. For example, the threshold value may be given as an intensity of exposure light. The generation of the OPC model for PR may also include selecting an appropriate model form from among various PR model forms.

A combination of the optical OPC model with the OPC model for PR is usually referred to as an OPC model. After the OPC model is generated, simulations are repeated and iterated using the OPC model. Simulations may be performed until a certain condition is satisfied. For example, a root mean square (RMS) of a CD error, an edge placement error (EPE), and/or a reference repeat count may be used as a condition of repeating a simulation. In a mask layout correction method according to some example embodiments, layout images or data that have undergone OPC, e.g., optical proximity corrected (OPC'ed) layout images or data, may be obtained by performing a simulation by using the OPC model. The OPC'ed layout images may be sent as mask tape-out (MTO) design data to a mask manufacturing team to manufacture masks later.

After the DB about the full-shot is received, the hierarchy of the DB may be analyzed in operation S120. Analyzing the hierarchy of the DB may refer to analyzing the hierarchy of a whole mask layout based on the DB. The analysis of the hierarchy of the mask layout may be required or used to extract and reconfigure a target layout to undergo OPC. The analysis of the hierarchy of the DB will be described in detail with reference to FIG. 3 below.

Subsequently, a density map or heat map may be generated and converted into a retarget rule table in operation S130. The density map may represent the densities of patterns in a full-chip. For example, a portion in which patterns concentrate may have a high density, and a portion in which patterns are sparse may have a low density. As in a full-shot, a full-chip may refer to the layout of patterns in the entirety of a single chip or die. The density map may be generated by using a kernel and/or by analyzing a space around a cell block. The densities may correspond to a portion of, or a percentage of, or a ratio of, an area of patterns within a region to an area of the region. The retarget rule table may be generated or converted through different processes, according to methods of generating the density map. The generating and converting the density map into the retarget rule table will be described in detail with reference to FIGS. 5A to 6C below.

After the density map is generated and converted into the retarget rule table, an OPC target cell layout to undergo OPC may be reconfigured in operation S140. Here, the OPC target cell layout may be or may correspond to a unit on which OPC is directly performed, and may include a set of several cells. In the full-chip cell CD correction method according to some example embodiments, the OPC target cell layout may include a set of regions, such as nine regions outside an optical influence range in a single cell block. The set of nine regions is usually called a 9 cell unit. Nine regions in a 9 cell unit may respectively represent a top left portion TL, a top (middle) portion T, a top right portion TR, a (middle) left portion L, a central portion C, a (middle) right portion R, a bottom left portion BL, a bottom portion B, and a bottom right portion BR (see FIG. 8C). The reconfiguration of the OPC target cell layout will be described again with reference to FIGS. 3 and 7 below.

After the OPC target cell layout is reconfigured, a first bias is applied to the OPC target cell layout based on the retarget rule table, in operation S150. Here, the application of the first bias may refer to increasing or decreasing the CD of a layout of patterns by the first bias, according to the density of the patterns. For example, the CD of a layout of patterns in a high-density portion may be decreased by the first bias, and the CD of a layout of patterns in a low-density portion may be increased by the first bias. The first bias may be set to a value that may fully or at least partially compensate for a CD error, which has been statistically calculated.

After the first bias is applied to the OPC target cell layout, an OPC'ed layout may be generated for a full-chip by performing hierarchical OPC in operation S160. The hierarchical OPC may be performed by obtaining an OPC'ed cell layout by performing OPC on the cell layout to which the first bias has been applied, obtaining an OPC'ed cell block layout by reflecting the OPC'ed cell layout on a cell block, and obtaining an OPC'ed full-chip layout by reflecting the OPC'ed cell block layout on a full-chip. Such a hierarchical OPC process may substantially be the same as hierarchical OPC performed on patterns in a peripheral region and patterns in a core region. A process of generating an OPC'ed layout for a full-chip by performing hierarchical OPC will be described in detail with reference to FIGS. 8A to 8D below.

In some example embodiments, the full-chip cell CD correction method may further include reflecting a CD error according to a position in an extreme ultraviolet (EUV) slit in an EUV exposure process using the EUV slit. The reflecting of the CD error according to a position in the EUV slit will be described in detail with reference to FIGS. 9A to 9D below.

According to some example embodiments, the full-chip cell CD correction method may effectively correct a CD error of a full-chip by generating a density map of a full-chip and performing OPC by applying a bias to an OPC target cell layout, while taking into account a pattern density based on the density map. In the case of an OPC method according to the related art, only a CD error caused by defocus occurring due to a step or topography of a lower layer of a single cell block is compensated for, and accordingly, only a CD error of an after develop inspection (ADI) pattern of the single cell block may be corrected. However, not only a defocus CD error occurs in an ADI pattern, but also CD errors, such as etch skew and/or mask CD errors caused by a difference in the density of patterns, occur according to a position in a full-chip, and therefore, all CD errors in the full-chip need to be corrected. Here, the mask CD error may refer to a CD error of a pattern on a mask. In the full-chip cell CD correction method according to some example embodiments, OPC is performed by applying a bias to an OPC target cell layout while taking into account a pattern density based on a density map of a full-chip, and accordingly, not only an ADI pattern CD error but also all CD errors, such as etch skew and mask CD errors caused by a difference in the pattern density, according to a position in the full-chip may be effectively corrected. Alternatively or additionally, in the full-chip cell CD correction method, a CD error according to a position in an EUV slit may also be corrected by reflecting the CD error according to the position in the EUV slit in an EUV exposure process.

Figure 2A:
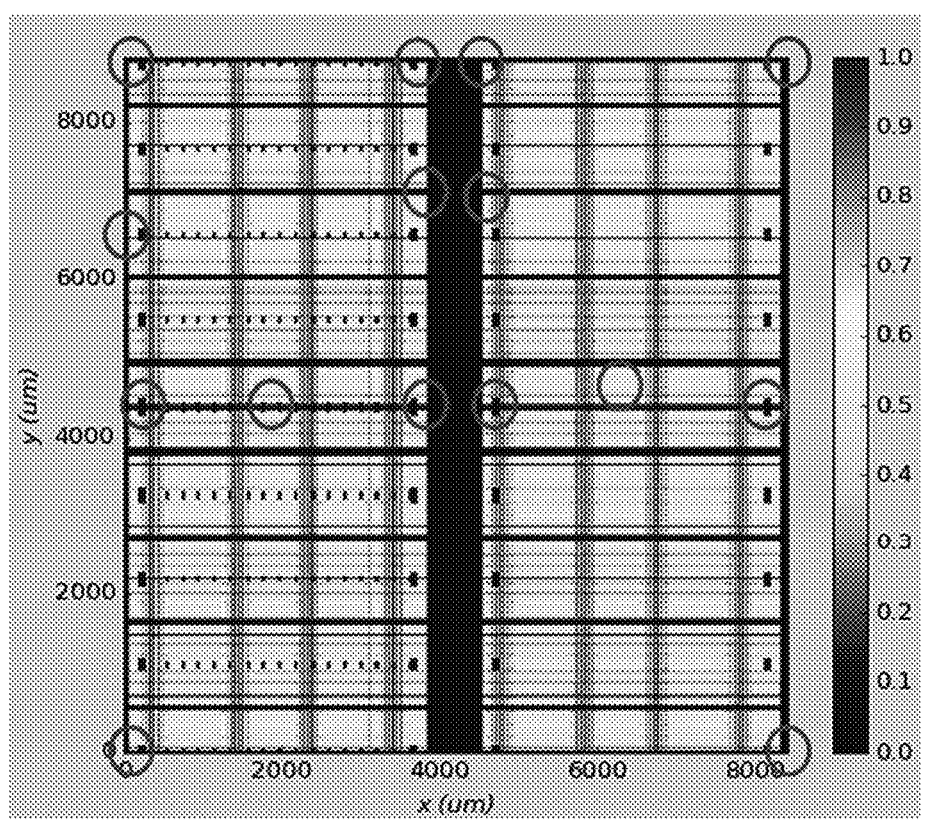

FIGS. 2A to 2C are respectively images of a pattern density map of a full-chip, cell CD errors in a bank center edge (BCE) and a bank edge edge (BEE), and cell CD errors according to positions in a chip.

Referring to FIGS. 2A to 2C, FIG. 2A shows the density map, which is extracted to analyze a CD difference according to a position in the full-chip. In the density map, each of portions marked with small circles may correspond to a portion in which an inflection occurs in a density, e.g. may correspond to a hot spot within the density of the full-chip. There may be more portions having an inflection in a density. FIG. 2A shows only several representative portions.

In FIG. 2B, is a projection along the x-axis of FIG. 2A. BCE shows CD errors in the center and edge of a cell block in the central portion of a bank. The shape of the CD errors of the BCE is more or less symmetrical. BEE shows CD errors in the center and edge of a cell block in the edge portion of the bank. The shape of the CD errors of the BEE is asymmetrical. The difference between the shape of the CD errors of the BCE and the shape of the CD errors of the BEE may be caused by a density difference around the various cell blocks.

In FIG. 2C, CBLC is the acronym for "chip bottom left corner" and shows CD errors in a cell block on the bottom left of the chip, while CTRC is the acronym for "chip top right corner" and shows CD errors in a cell block on the top right of the chip. Peri shows CD errors in a cell block adjacent to a peripheral region at the center of the chip. As shown in the drawings, cell blocks adjacent to the edge and peripheral regions of a chip or die may have a great pattern density difference and thus have different types of CD errors.

Consequently, CD errors of a cell block appear differently according to a pattern density within a full-chip, and accordingly, it may be expected that the pattern density in the full-chip needs to or is desired to be accommodated to more accurately correct the CD errors of the cell block. In an OPC method according to the related art, a cell block is divided into nine regions outside an optical influence range and reconfigured into a 9 cell unit, an ADI CD error is predicted, and a CD error is corrected. Thereafter, to compensate or at least partially compensate for a long range of about 10 microns (μm), the topography of a lower layer and/or the tendency of etch skew are analyzed, a retarget rule table is generated, and a CD error is corrected. However, because one retarget rule table is reflected on the entire full-chip in the OPC method according to a related art, CD errors in the entire full-chip may not be satisfactorily corrected. Contrarily, in the full-chip cell CD correction method according to some example embodiments, a density map of an entire full-chip is extracted, a retarget rule table is generated based on the density map, and OPC is performed to reflect the retarget rule table on an OPC target cell layout generated through reconfiguration, and accordingly, CD errors in the entire full-chip may be more effectively corrected.

FIG. 3 is a conceptual diagram of an operation of analyzing the hierarchy of the DB in the full-chip cell CD correction method of FIG. 1.

Referring to FIG. 3, the leftmost image is an image of a full-shot. A single full-shot may include a plurality of full-chips, and may or may not include corresponding scribe lines. The full-chips of the full-shot may have substantially the same hierarchical structure. The second left image is an image of a full-chip. The full-chip may include a plurality of banks, for example a plurality of memory banks. In the second left image, regions defined by white lines may respectively correspond to banks. Each bank may include a plurality of cell blocks, for example a plurality of memory cell blocks. Banks and cell blocks may have different hierarchical structures according to positions thereof in the full chip.

The third left image is an image of a cell block in a full-chip or a bank. The cell block may have different hierarchical structures at different regions or positions. Accordingly, it may take a lot of time to perform OPC on the entirety of the cell block. For this reason, the cell block is reconfigured into an OPC target cell layout. The OPC target cell layout may correspond to a unit such as a minimum unit on which OPC is substantially performed. For example, as described above, representative regions may be extracted from the cell block and reconfigured into the OPC target cell layout. The rightmost image is an image of the OPC target cell layout. For example, the OPC target cell layout includes a 9 cell unit, which may represent the top left portion TL, the top portion T, the top right portion TR, the left portion L, the central portion C, the right portion R, the bottom left portion BL, the bottom portion B, and the bottom right portion BR (see FIG. 8C). When OPC is performed on the OPC target cell layout, an OPC'ed cell layout may be generated. As described above, a cell block may be reconfigured into an OPC target cell layout through hierarchy analysis, and OPC may be performed on the OPC target cell layout. Thereafter, OPC may be completely performed on a full-chip by expansively reflecting an OPC'ed cell layout in a reverse process.

Figure 4A:
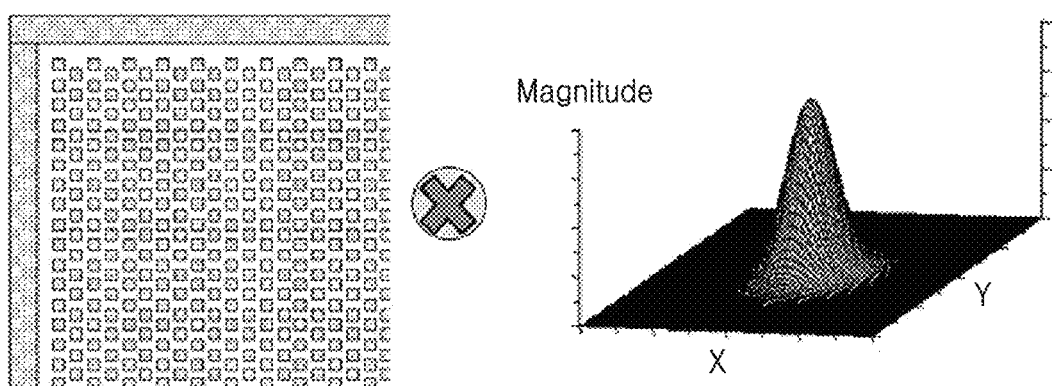
FIGS. 4A and 4B show images for describing a process of generating a density map of a full-chip.
Figure 4B:
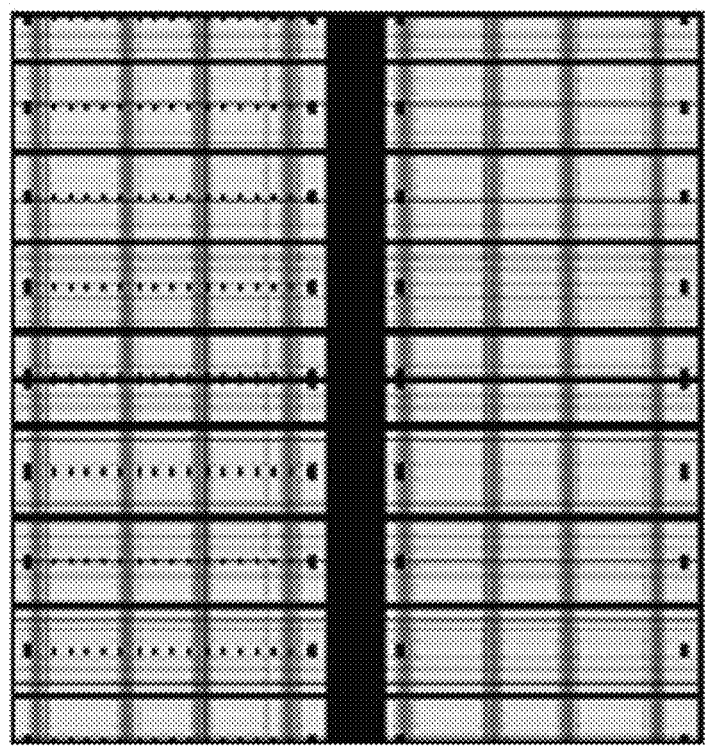
Figure 4C:
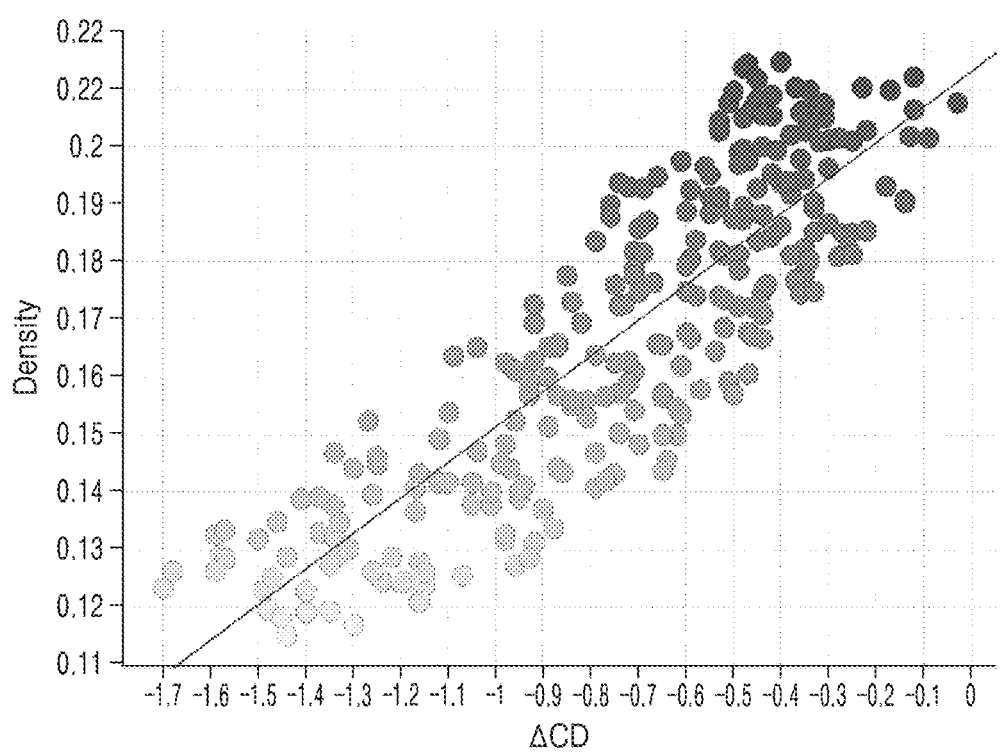
FIG. 4C is a graph showing the relationship between a density and a CD error.

FIGS. 4A and 4B show images for describing a process of generating a density map of a full-chip, and FIG. 4C is a graph showing the relationship between a density and a CD error. In FIG. 4C, the x-axis is a CD error ΔCD in an arbitrary unit, and the y-axis is a density in an arbitrary unit.

Referring to FIGS. 4A and 4B, to extract a density map such as an accurate density map of a full-chip, the layout of the full-chip may be convolved with a kernel function, as shown in FIG. 4A. The kernel function may be Gaussian; however, example embodiments are not limited thereto. A cell block edge portion is shown on the left of FIG. 4A as a part of the layout of the full-chip, and a kernel function, e.g., a space domain of a Gaussian kernel function, is shown on the right of FIG. 4A. The $\otimes$ at the center represents a convolution operator. The convolution operator may be represented with an asterisk (*) by some users. The convolution may or may not be performed with a Fourier transform; example embodiments are not limited thereto. As described above, the density map of the full-chip shown in FIG. 4B may be generated by performing convolution on the layout of the full-chip with the kernel function. Alternatively or additionally, a schematic density map of the full-chip may be generated. This will be described in detail with reference to FIGS. 6A to 6C below.

Referring to FIG. 4C, it may be seen that the CD error (horizontal axis) increases as the density (vertical axis) decreases. This may be because an etch difference, e.g., an etch skew, occurs according to the density. For example, because etching is performed better or more accurately in a low-density region than in a high-density region, a CD in the low-density region may be less than a reference CD such that a CD error may increase in the low-density region. Consequently, to more accurately correct a CD error of a full-chip, a density in the full-chip needs to or is desired to be accounted for on OPC.

Figure 5A:
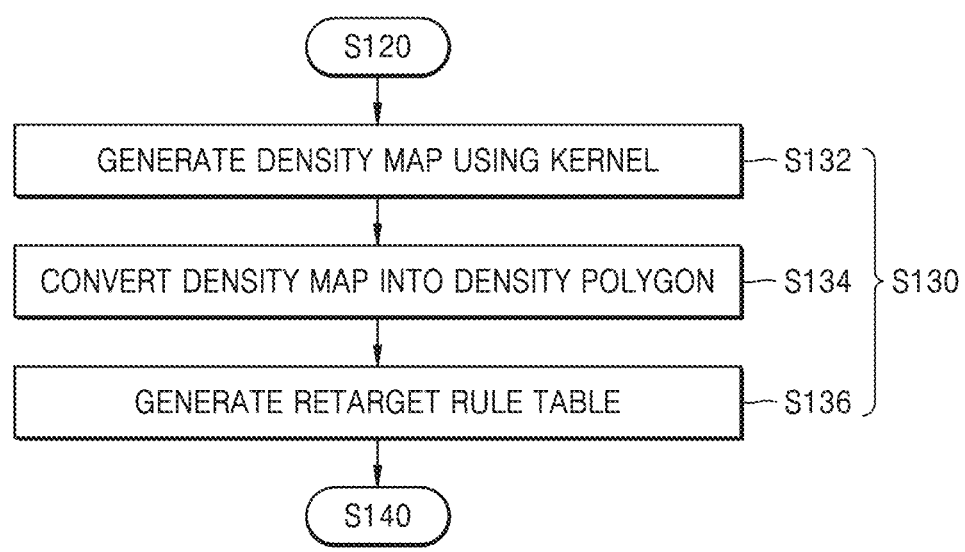
FIG. 5A is a flowchart of sub operations of an operation of generating and converting a density map into a retarget rule table in the full-chip cell CD correction method of FIG. 1, according to some example embodiments.

FIG. 5A is a flowchart of sub operations of the operation of generating and converting the density map into the retarget rule table in the full-chip cell CD correction method of FIG. 1, and FIGS. 5B to 5D show images respectively corresponding to the sub operations.

Figure 5B:
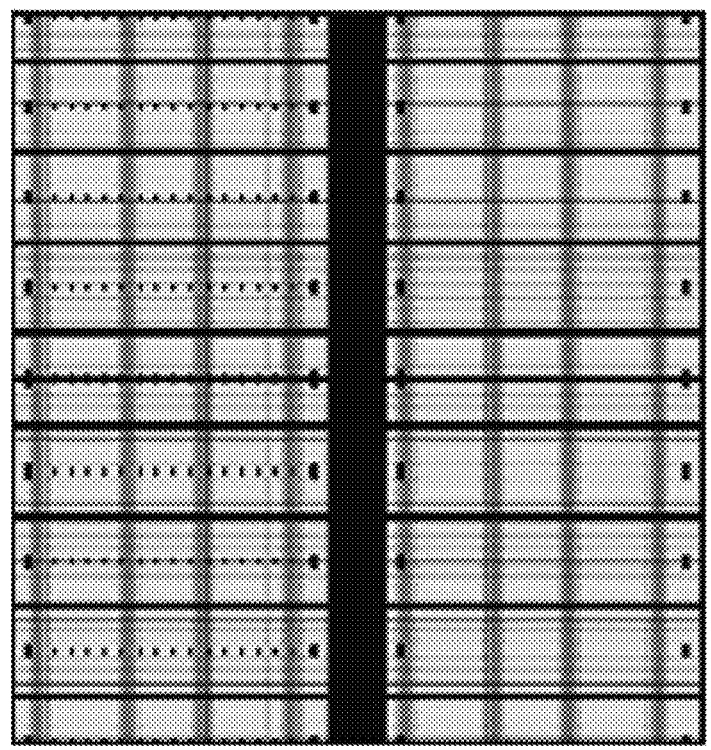
FIGS. 5B to 5D show images respectively corresponding to the sub operations.

Referring to FIGS. 5A and 5B, operation S130 of generating and converting the density map into the retarget rule table may include generating the density map of the full chip by using a kernel in operation S132. For example, the kernel may include a Gaussian kernel; however, example embodiments are not limited thereto. The density map may be generated by performing convolution on the layout of the full-chip with the Gaussian kernel. Through this process, the density map of FIG. 5B may be generated.

Figure 5C:
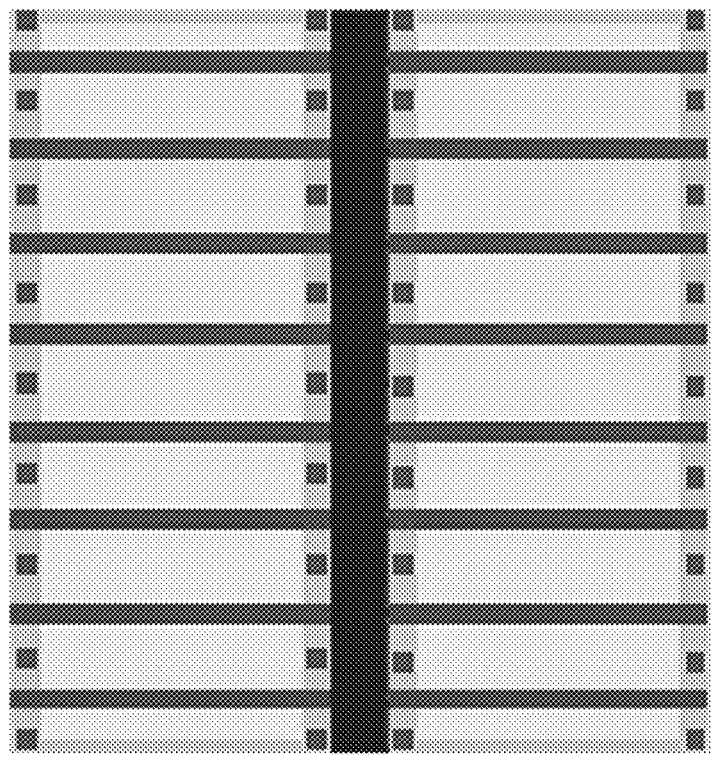

Referring to FIGS. 5A and 5C, after the density map is generated, the density map may be converted into a density polygon by applying a filter to the density map in operation S134. For example, the density map may be converted into the density polygon by filtering the density map using thresholds. For example, assuming that densities in the density map range from 0.0 to 1.0, the density map may be divided into a region corresponding to 0.0 to 0.2 (e.g. 0% to 20S), a region corresponding to 0.2 to 0.4 (e.g. 20% to 40%), a region corresponding to 0.4 to 0.6 (e.g. 40% to 60%), a region corresponding to 0.6 to 0.8 (e.g. 60% to 80%), and a region corresponding to 0.8 to 1.0 (e.g. 80% to 100%) using set thresholds. Each of the regions may be converted into a polygon. The number of regions and/or the formation of a polygon may vary with the number of set thresholds. FIG. 5C shows the density polygon obtained by applying the filter to the density map.

Consequently, the conversion of the density map into the density polygon may correspond to a process of simplifying the density map, which is complexly structured with a large number of density values, into several density regions with a smaller number of density values. There may be a quantization of density values. For example, densities in the density map may be divided in very small units, and densities in the density polygon may be divided in relatively large units. For example, densities in the density polygon described above may be divided in 0.2 units, and densities in the density map before being converted into the density polygon may be divided in units less than 0.1. The density polygon of FIG. 5C is a very simplified version. Example embodiments are not limited thereto, and regions in each cell block may be subdivided into density polygons.

Referring to FIGS. 5A to 5D, after the conversion into the density polygon, a retarget rule table for the density polygon may be generated in operation S136. The retarget rule table may refer to a table of biases to be applied, which are calculated according to densities in respective regions. For example, it may be determined or recorded in the retarget rule table that a bias of a first ΔCD is applied to a region having a first density, a bias of a second ΔCD is applied to a region having a second density, and a bias of a third ΔCD is applied to a region having a third density. The bias values, such as the first ΔCD, the second ΔCD, and the third ΔCD, may be determined by statistically calculating CD errors according to densities.

Figure 5D:

The retarget rule table may be generated for each cell block. For example, the retarget rule table may be generated by setting a bias according to a density in each cell block. In FIG. 5D, a large rectangular box corresponds to a cell block, and biases are respectively allocated to cells in the cell block and marked with different shades. In other words, a single large rectangular box may correspond to a retarget rule table corresponding to a cell block.

According to various example embodiments, operation S136 of generating the retarget rule table may be considered as a process of applying a retarget rule table to a density polygon, into which a density map is converted. For example, bias values according to densities may be preset, and accordingly, the bias values may be allocated to the density polygon in operation S136 of generating the retarget rule table. This may be considered as a process of mapping the density polygon using the retarget rule table.

Figure 6A:
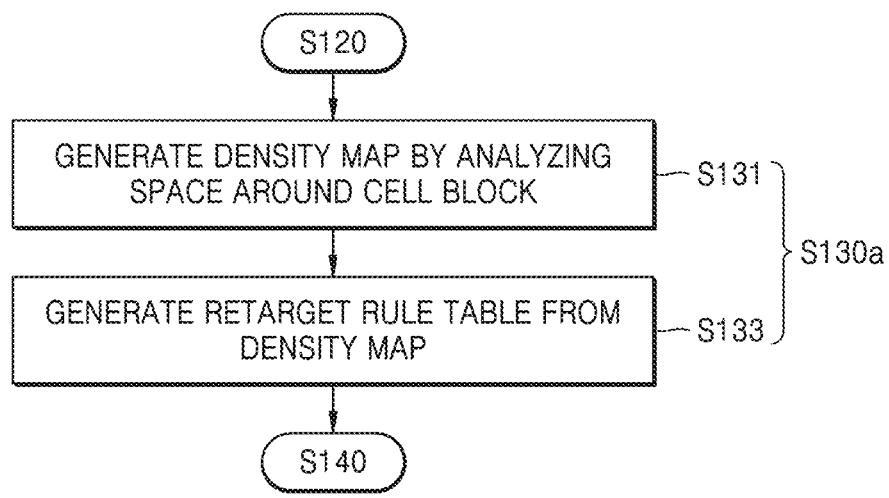
FIG. 6A is a flowchart of sub operations of the operation of generating and converting the density map into the retarget rule table in the full-chip cell CD correction method of FIG. 1, according to some example embodiments.
Figure 6B:
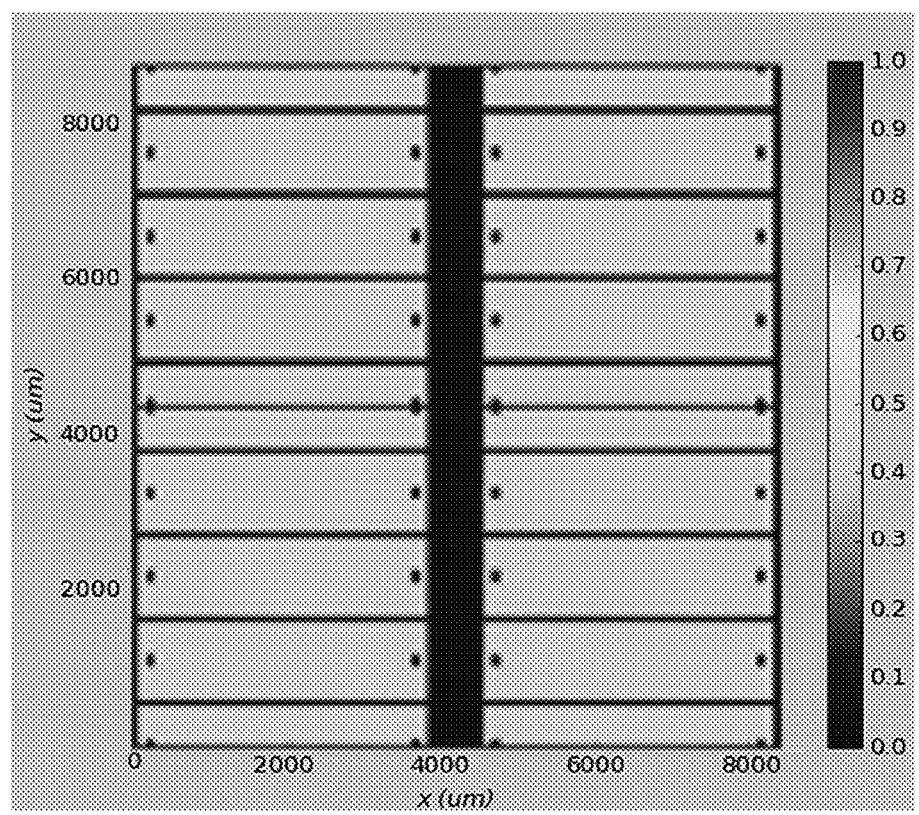

FIG. 6A is a flowchart of sub operations of the operation of generating and converting the density map into the retarget rule table in the full-chip cell CD correction method of FIG. 1, according to various example embodiments, and FIGS. 6B and 6C show images respectively corresponding to the sub operations.

Referring to FIGS. 6A and 6B, the density map may be generated by analyzing a cell block, without using a kernel such as a Gaussian kernel, in the full-chip cell CD correction method. In detail, operation S130a of generating and converting the density map into the retarget rule table may include generating the density map by analyzing space around a cell block in operation S131. For example, the density map may be generated by measuring a space between cells in the layout of the full-chip or analyzing densities in the layout of the full-chip. At this time, the density map may be generated in a simple form, as shown in FIG. 6B. In other words, distinguishment between regions having different densities in the density map may not be much complex.

Referring to FIGS. 6A and 6C, after the density map is generated, the retarget rule table may be generated based on the density map in operation S133. The concept of the retarget rule table has been described above with reference to FIGS. 5A to 5D. Consequently, in the full-chip cell CD correction method according to some example embodiments, the density map is generated in a simple form, and accordingly, a process of converting the density map into a density polygon through filtering may be omitted. Therefore, the retarget rule table may be directly generated from the density map. For example, in the retarget rule table of FIG. 6C, density values A to E are allocated to regions.

As described above with reference to FIGS. 5A to 5D, operation S133 of generating the retarget rule table may be considered as a process of applying the retarget rule table to the density map, according to some example embodiments. For example, bias values according to densities may be preset, and accordingly, the bias values according to densities may be allocated to the density map in operation S133 of generating the retarget rule table. For example, in the retarget rule table of FIG. 6C, the density values A to E may be respectively allocated to regions, and then bias values may be respectively allocated to the density values A to E.

Figure 7:
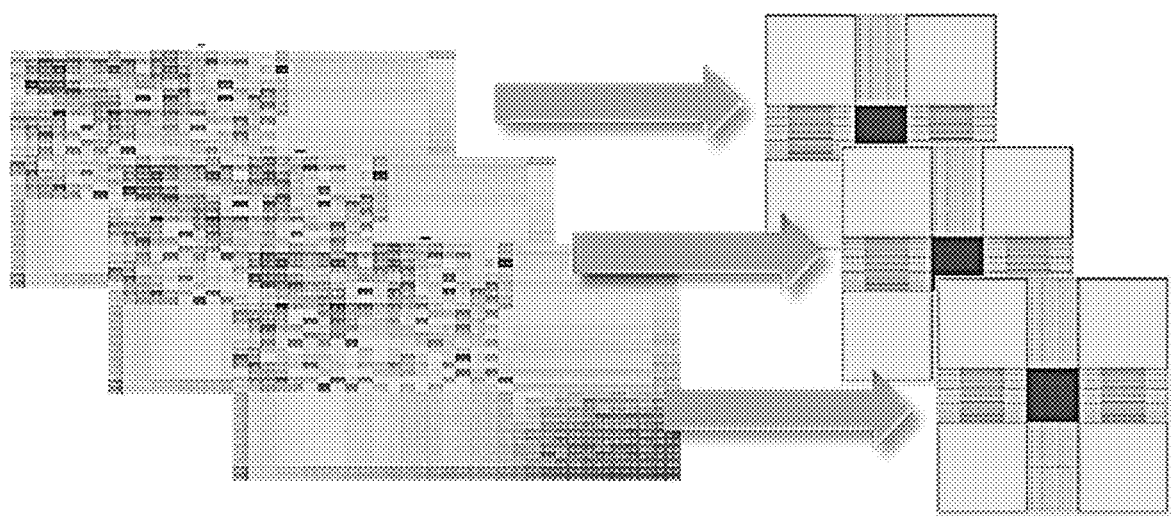
FIG. 7 is an image showing an operation of reconfiguring a cell block into an optical proximity correction (OPC) target cell layout for OPC and an operation of applying a first bias to the OPC target cell layout in the full-chip cell CD correction method of FIG. 1.

FIG. 7 is an image showing an operation of reconfiguring a cell block into the OPC target cell layout for OPC and an operation of applying the first bias to the OPC target cell layout in the full-chip cell CD correction method of FIG. 1.

Referring to FIG. 7, as described above with reference to FIG. 3, it may take a long time to perform OPC on an entire cell block. Therefore, according to some example embodiments, the full-chip cell CD correction method may include a process of reconfiguring a cell block into an OPC target cell layout. For example, as shown on the right of FIG. 7, each cell block may be reconfigured into a corresponding OPC target cell layout.

The images on the left of FIG. 7 may respectively correspond to retarget rule tables respectively corresponding to cell blocks, as described above with reference to FIGS. 5A to 5D. In an OPC method according to the related art, an OPC'ed cell layout may be generated by performing OPC on the OPC target cell layout. In this case, CD errors at different positions in a full-chip, such as etch skew or mask CD errors caused by a pattern density difference according to a position in the full-chip, may not be corrected.

However, in the full-chip cell CD correction method according to some example embodiments, before OPC is performed on the OPC target cell layout, the first bias is applied to the OPC target cell layout, based on the retarget rule table. In other words, based on the retarget rule table, ΔCD corresponding to the first bias may be applied to the OPC target cell layout. For example, a reference CD of the OPC target cell layout may be increased or decreased by ΔCD. Thereafter, the OPC'ed cell layout may be generated by performing OPC on the OPC target cell layout to which the first bias has been applied. Because the OPC'ed cell layout reflects the pattern density of the full-chip through the first bias in the full-chip cell CD correction method according to some example embodiments, CD errors at different positions in the full-chip, such as etch skew or mask CD errors caused by a pattern density difference according to a position in the full-chip, may be effectively corrected.

Figure 8A:
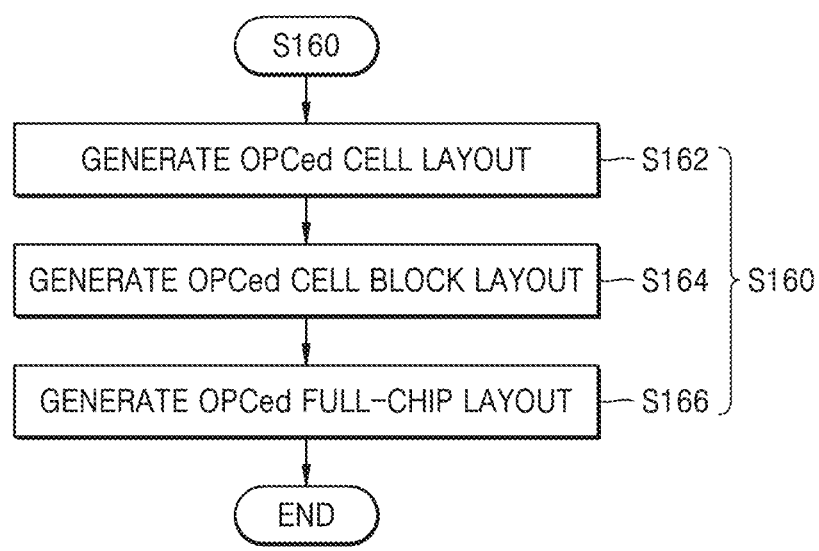
FIG. 8A is a flowchart of sub operations of an operation of generating a layout that has undergone OPC, i.e., an optical proximity corrected (OPC'ed) layout, for a full-chip by performing hierarchical OPC in the full-chip cell CD correction method of FIG. 1, according to some example embodiments.
Figure 8B:
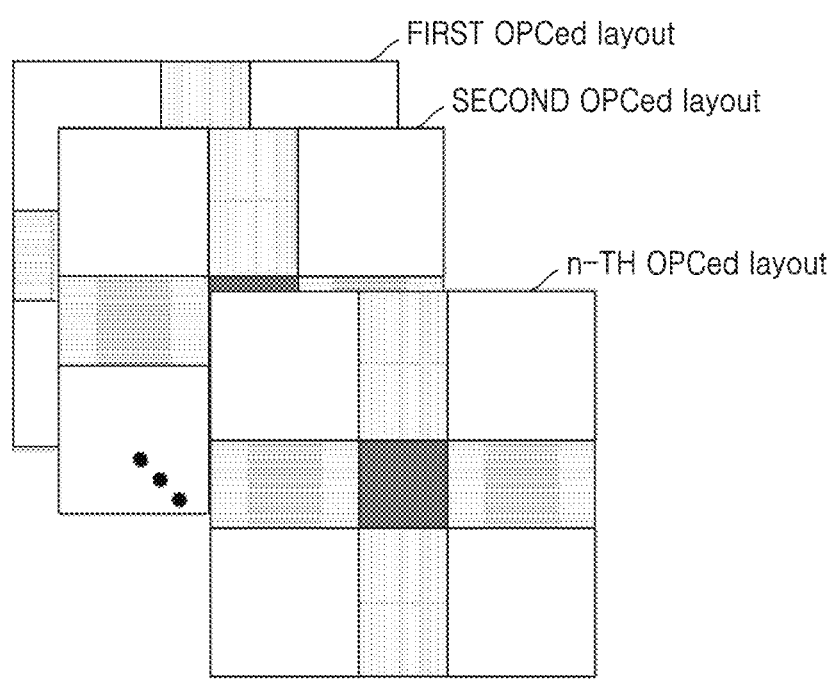
FIGS. 8B to 8D show images respectively corresponding to the sub operations.
Figure 8C:
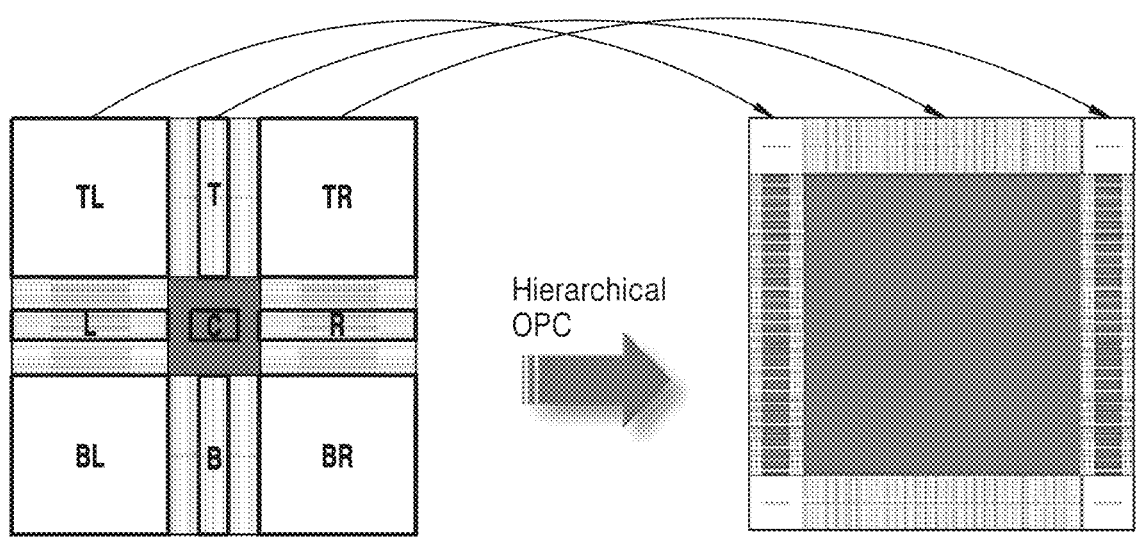
Figure 8D:
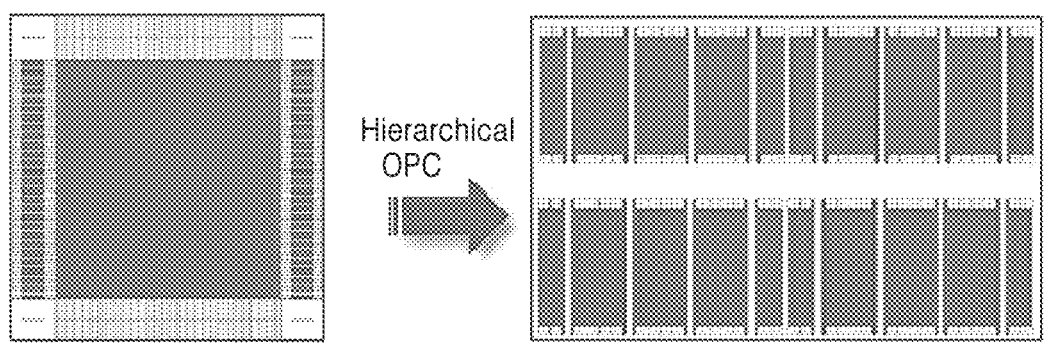

FIG. 8A is a flowchart of sub operations of the operation of generating the OPC'ed layout for the full-chip by performing the hierarchical OPC in the full-chip cell CD correction method of FIG. 1, according to some example embodiments, and FIGS. 8B to 8D show images respectively corresponding to the sub operations.

Referring to FIGS. 8A and 8B, in the full-chip cell CD correction method according to some example embodiments, operation S160 of generating the OPC'ed layout for the full-chip by performing the hierarchical OPC may include generating an OPC'ed cell layout by performing OPC on the OPC target cell layout, to which the first bias has been applied, in operation S162. The first bias may be generated based on the retarget rule table and applied to the OPC target cell layout obtained by reconfiguring a cell block.

Referring to FIGS. 8A and 8C, after the OPC'ed cell layout is generated, an OPC'ed cell block layout may be generated by configuring a cell block by using the OPC'ed cell layout in operation S164. A process of generating the OPC'ed cell block layout may be reverse to the process of reconfiguring the cell block into the OPC target cell layout, which has been described above. In other words, the OPC'ed cell block layout may be generated by configuring the entirety of a cell block by reflecting each region of the OPC'ed cell layout on a corresponding portion of the cell block. For example, the OPC'ed cell block layout may be generated for the entirety of the cell block by configuring the top left corner of the cell block from the top left portion TL of the OPC'ed cell layout, configuring the top side of the cell block from the top portion T of the OPC'ed cell layout, configuring the top right corner of the cell block from the top right portion TR of the OPC'ed cell layout, and so on.

Referring to FIGS. 8A and 8D, after the OPC'ed cell block layout is generated, an OPC'ed full-chip layout may be generated by configuring a full-chip by using the OPC'ed cell block layout in operation S166. A process of generating the OPC'ed full-chip layout may be reverse to the process of decomposing the full-chip into cell blocks, which has been described above. For example, the OPC'ed full-chip layout may be generated by configuring a full-chip by reflecting a plurality of OPC'ed cell block layouts on respectively corresponding portions of the full-chip. A step of manufacturing a photomask based on the OPC'ed layout (not illustrated), and a step of fabricating a semiconductor device based on the manufactured photomask (not illustrated) may be performed.

Figure 9A:
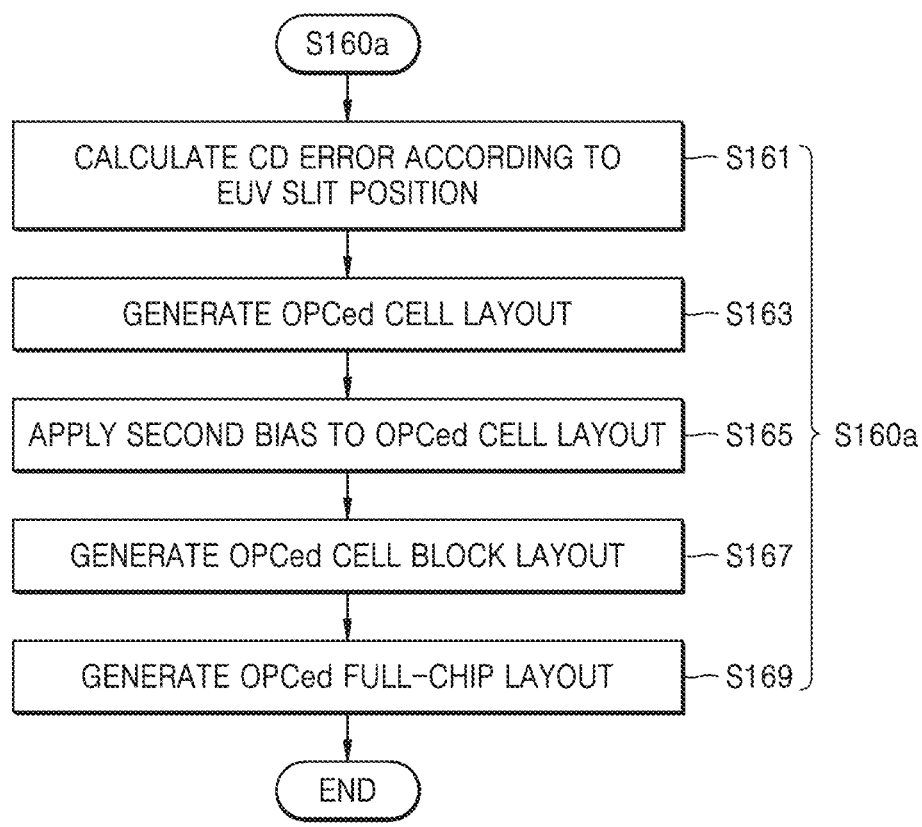
FIG. 9A is a flowchart of sub operations of an operation of generating an OPC'ed layout for a full-chip by performing hierarchical OPC in the full-chip cell CD correction method of FIG. 1, according to some example embodiments.
Figure 9B:
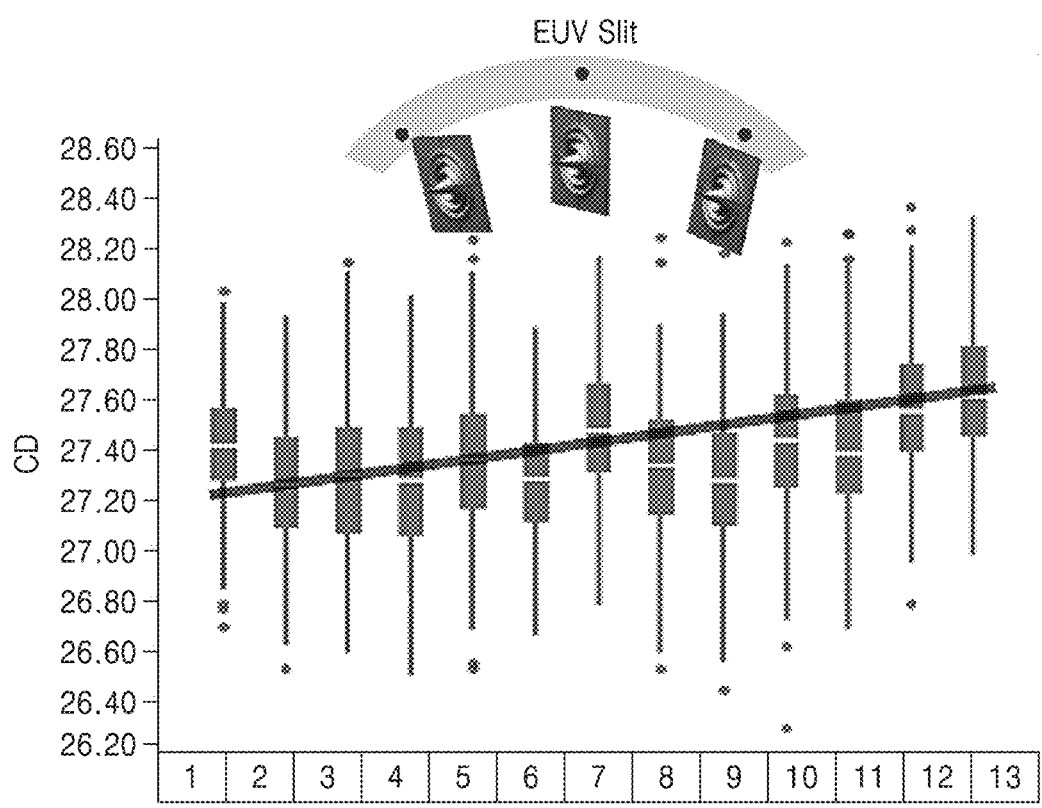
FIGS. 9B to 9D show images corresponding to the sub operations.
Figure 9C:
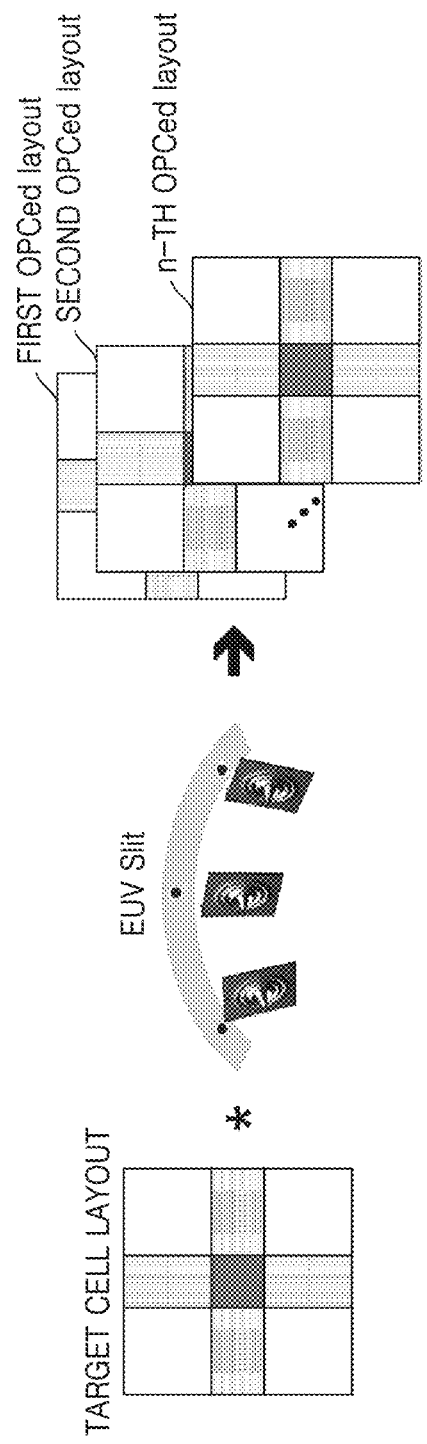
Figure 9D:
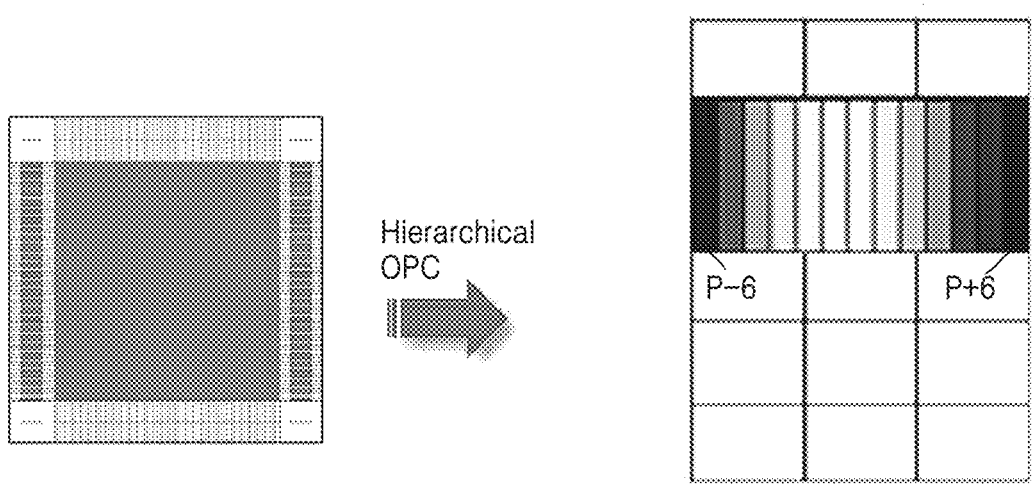

FIG. 9A is a flowchart of sub operations of an operation of generating an OPC'ed layout for a full-chip by performing hierarchical OPC in the full-chip cell CD correction method of FIG. 1, according to some example embodiments. FIG. 9B is a graph of CD with respect to a position in an EUV slit, and FIGS. 9C and 9D show images corresponding to the sub operations.

Referring to FIGS. 9A to 9D, the full-chip cell CD correction method may be applied to an EUV exposure process. In the EUV exposure process, a CD error may vary with a position in an EUV slit. As shown in FIG. 9B, when positions in an EUV slit are divided into 13 positions, it may be seen that a CD is different at each of the 13 positions. Accordingly, it may be seen that a CD error according to a position in a slit needs to be reflected during OPC in the EUV exposure process.

In the full-chip cell CD correction method according to some example embodiments, operation S160a of generating an OPC'ed layout for a full-chip by performing hierarchical OPC may include calculating a CD error according to an EUV slit position with respect to an OPC target cell layout, to which a first bias has been applied, in operation S161. The CD error according to an EUV slit position may be calculated by applying a kernel function according to the EUV slit position to a target cell layout, as shown in FIG. 9C, or may be statistically calculated.

Thereafter, an OPC'ed cell layout may be generated by performing OPC on an OPC target cell layout, to which the first bias has been applied, in operation S163. As described above, the bias may be generated based on a retarget rule table and applied to the OPC target cell layout obtained through reconfiguration of a cell block.

After the OPC'ed cell layout is generated, a second bias may be applied to the OPC'ed cell layout, based on the CD error according to an EUV slit position, in operation S165. The second bias may be statistically calculated based on the CD error according to an EUV slit position. In other words, ΔCD to be corrected may be statistically calculated based on the CD error according to an EUV slit position and reflected on the OPC'ed cell layout. For example, the reflection may be performed by applying the first ΔCD to an OPC'ed cell layout corresponding to a first EUV slit position, applying the second ΔCD to an OPC'ed cell layout corresponding to a second EUV slit position, applying the third ΔCD to an OPC'ed cell layout corresponding to a third EUV slit position, and so on.

According to various example embodiments, the OPC'ed cell layout may be generated by applying the second bias to the OPC target cell layout, to which the first bias has been applied, and performing OPC on the OPC target cell layout, to which the first bias and the second bias have been applied. Because the second bias is applied to a wide range corresponding to a full-shot, it may not matter whether to apply the second bias before or after the OPC is performed.

Thereafter, the processes described with reference to FIGS. 8A to 8D may be performed. In detail, after the OPC'ed cell layout is generated, an OPC'ed cell block layout may be generated by configuring a cell block by using the OPC'ed cell layout in operation S167. After the OPC'ed cell block layout is generated, an OPC'ed full-chip layout may be generated by configuring a full-chip by using the OPC'ed cell block layout in operation S169. The CD error according to an EUV slit position may be directly reflected on the OPC'ed full-chip layout. FIG. 9D shows with different shades at different EUV slit positions that a CD error has been reflected. For example, assuming that a shade represents the degree of CD error compensation, it may be seen that there is little CD error compensation at a central EUV slit position and that CD error compensation is reflected to a greatest degree at a sixth position P−6 on the left of the central EUV slit position and at a sixth position P+6 on the right of the central EUV slit position. Although the descriptions have been given based on an OPC'ed full-chip layout, the descriptions may be extended to a concept of generating an OPC'ed full-shot layout by configuring a full-shot by reflecting an OPC'ed full-chip layout on a corresponding portion of the full-shot.

Figure 10:
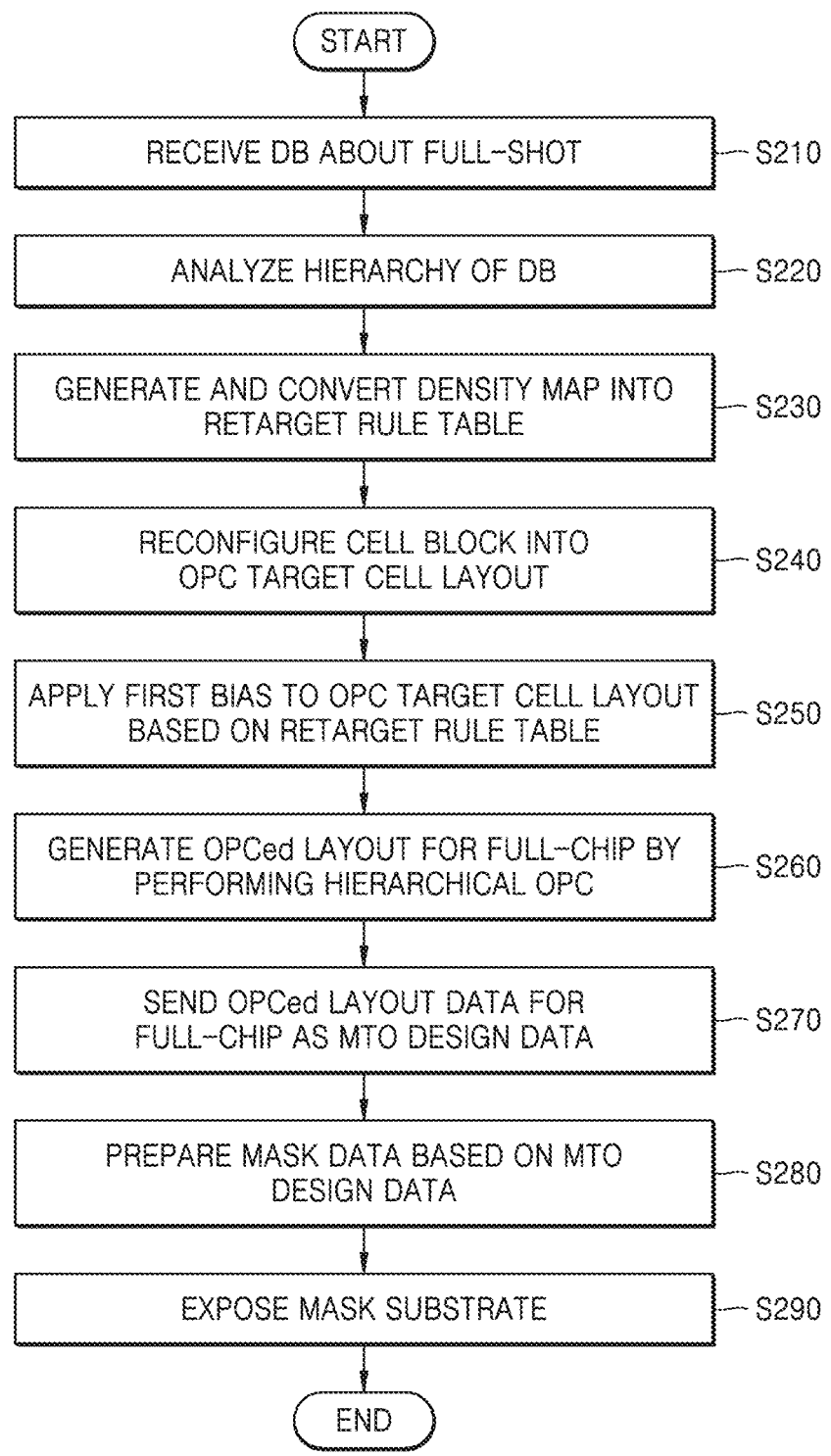
FIG. 10 is a schematic flowchart of a method of manufacturing a mask by using a full-chip cell CD correction method, according to some example embodiments.

FIG. 10 is a schematic flowchart of a method of manufacturing a mask by using a full-chip cell CD correction method, according to some example embodiments.

Referring to FIG. 10, the method of manufacturing a mask by using a full-chip cell CD correction method (hereinafter, simply referred to as the "mask manufacturing method") sequentially includes operations S210 to S260, wherein a DB is received in operation S210 and an OPC'ed layout for a full-chip is generated in operation S260. Operations S210 to S260 are substantially the same as operations S110 to S160 in FIG. 1.

Thereafter, OPC'ed layout data for the full-chip may be sent as MTO design data to a mask manufacturing team in operation S270. In general, MTO may refer to sending final mask data obtained through an OPC method to a mask manufacturing team to manufacture a mask. Accordingly, the MTO design data may be substantially the same as data about an OPC'ed full-chip layout obtained through the full-chip cell CD correction method. The MTO design data may have a graphic data format used in electronic design automation (EDA) software. For example, the MTO design data may have a data format such as graphic data system II (GDS2) and/or open artwork system interchange standard (OASIS).

Thereafter, mask data preparation (MDP) may be performed in operation S280. For example, the MDP may include i) format conversion called fracturing; ii) augmentation of a bar code for machine reading, a standard mask pattern for inspection, or a job deck; and iii) automatic and manual verifications. Here, the job deck may refer to creation of a text file about a series of instructions including information about the arrangement of multiple mask files, a reference dose, or an exposure speed or method.

The format conversion, e.g., fracturing, may refer to a process of dividing the MTO design data into regions and converting the MTO design data into a format for an electron beam (e-beam) writer. For example, the fracturing may include data manipulation such as scaling, data sizing, rotation of data, or pattern reflection. In the conversion process through the division, data about numerous systematic errors, which may occur in a process of sending design data to an image on a wafer, may be corrected. The correction of the data about the systematic errors may be referred to as mask process correction (MPC), which may include CD adjustment and an operation of increasing pattern arrangement accuracy. Accordingly, the fracturing may contribute to an increase in quality of a mask and may be performed in advance for the MPC. Here, the systematic errors may be caused by distortion occurring during an exposure process, a mask development and etching process, a wafer imaging process, or the like.

The MDP may include MPC. As described above, the MPC is a process of fully or at least partly correcting errors, e.g., systematic errors, occurring during an exposure process. Here, the exposure process may be a concept generally including e-beam writing, development, etching, and baking. In addition, data processing may be performed before the exposure process. The data processing may be preprocessing of mask data and include grammar check on the mask data and exposure time prediction. Through the MDP, e-beam data may be generated to exposure a mask substrate.

After the mask data is prepared, a mask substrate may be exposed using the mask data, i.e., e-beam data, in operation S290. Here, exposing may refer to, for example, e-beam writing. For example, the e-beam writing may be performed by a gray writing method using a multi-beam mask writer (MBMW). The exposure process may also be performed using a variable shape beam (VSB) writer.

After the MDP, a process of converting e-beam data into pixel data may be performed before the exposure process. The pixel data may be directly used for actual exposure and include data about the shape of an object to be exposed and data about an e-beam dose allocated to the data about the shape. Here, the data about the shape may include bit-map data, into which shape data corresponding to vector data has been converted through rasterization.

After the exposure process, a series of processes may be performed to completely manufacture the mask. For example, the series of processes may include development, etching, and cleaning. The series of processes may also include measurement, defect inspection, or defect repair. The series of processes may also include pellicle coating. The pellicle coating may refer to a process of attaching a pellicle to a mask after confirming that there are no pollutant particles or chemical stains through final cleaning and inspection so as to protect the surface of the mask from contamination during the shipment and working life of the mask.

According to some example embodiments, the mask manufacturing method may enable a reliable mask to be manufactured by effectively correcting cell CD errors in a full-chip by using the full-chip cell CD correction method of FIG. 1. For example, in the full-chip cell CD correction method according to some example embodiments, OPC is performed by applying a bias to an OPC target cell layout, taking into account a pattern density, based on a density map of a full-chip, and accordingly, not only an ADI pattern CD error but also all CD errors, such as etch skew and mask CD errors caused by a difference in the pattern density, according to a position in the full-chip may be effectively corrected. In addition, a CD error according to a position in an EUV slit may also be corrected by reflecting the CD error according to the position in the EUV slit in an EUV exposure process. Therefore, a reliable mask or EUV mask may be manufactured using the mask manufacturing method, according to some example embodiments, When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While inventive concepts have been particularly shown and described with reference to embodiments thereof, it will be understood that various changes in form and details may be made therein without departing from the spirit and scope of the following claims. Furthermore example embodiments are not necessarily mutually exclusive with one another. For example, some example embodiments may include one or more features described with reference to one or more figures, and may also include one or more other features described with reference to one or more other figures.

What is claimed is:

1. A full-chip cell critical dimension (CD) correction method comprising:
   receiving a database (DB) about a full-shot;
   analyzing a hierarchy of the DB;
   generating a density map of a full-chip by using the DB;
   converting the density map into a retarget rule table, the converting including mapping the density map using a density rule;

reconfiguring cell blocks of the full-chip into an optical proximity correction (OPC) target cell layout;

applying a first bias to the OPC target cell layout based on the retarget rule table; and generating an optical proximity corrected (OPC'ed) layout for the full-chip by performing hierarchical OPC.

2. The full-chip cell CD correction method of claim 1, wherein the generating and converting of the density map into the retarget rule table includes:

generating the density map;

converting the density map into a density polygon by filtering the density map using set thresholds; and generating the retarget rule table by using the density polygon.

3. The full-chip cell CD correction method of claim 2, wherein the generating the density map includes:

performing convolution on a layout of a chip, the performing the convolution being with a kernel;

dividing densities in the density map by a first unit; and dividing densities in the density polygon by a second unit, wherein an area of the first unit is less than an area of the second unit.

4. The full-chip cell CD correction method of claim 1, wherein the generating and converting of the density map into the retarget rule table includes:

generating the density map; and generating the retarget rule table based on the density map.

5. The full-chip cell CD correction method of claim 4, wherein the generating the density map includes analyzing a space around a reference cell block.

6. The full-chip cell CD correction method of claim 1, wherein the performing the hierarchical OPC includes a same process on patterns in a peripheral region and on patterns in a core region.

7. The full-chip cell CD correction method of claim 6, wherein the generating of the OPC'ed layout for the full-chip includes:

generating an OPC'ed cell layout by performing OPC on the OPC target cell layout having the first bias applied thereto;

generating an OPC'ed cell block layout by configuring a cell block using the OPC'ed cell layout; and generating an OPC'ed full-chip layout by configuring the full-chip using the OPC'ed cell block layout.

8. The full-chip cell CD correction method of claim 1, wherein the generating of the OPC'ed layout for the full-chip includes generating the OPC'ed layout for the full-chip based on a CD error according to a position in an extreme ultraviolet (EUV) slit.

9. The full-chip cell CD correction method of claim 8, wherein the generating of the OPC'ed layout for the full-chip further includes:

calculating the CD error according to the position in the EUV slit with respect to the OPC target cell layout having the first bias applied thereto;

generating an OPC'ed cell layout by performing OPC on the OPC target cell layout;

applying a second bias to the OPC'ed cell layout according to the CD error and the position in the EUV slit;

generating an OPC'ed cell block layout by configuring a cell block by using the OPC'ed cell layout having the second bias applied thereto; and generating an OPC'ed full-chip layout by configuring the full-chip using the OPC'ed cell block layout.

10. The full-chip cell CD correction method of claim 1, wherein the OPC'ed layout for the full-chip is generated to compensate for one or more of a CD error caused by defocus, a CD error caused by a pattern density according to a position in the full chip, and a CD error according to a position in an extreme ultraviolet (EUV) slit.

11. A full-chip cell critical dimension (CD) correction method comprising:

receiving a database (DB) about a full-shot;

analyzing a hierarchy of the DB;

generating a density map of a full-chip by using the DB and converting the density map into a retarget rule table, the converting including mapping the density map using a density rule;

reconfiguring cell blocks of the full-chip into an optical proximity correction (OPC) target cell layout for OPC;

applying a first bias to the OPC target cell layout, based on the retarget rule table;

generating an optical proximity corrected (OPC'ed) cell layout by performing OPC on the OPC target cell layout having the first bias applied thereto;

generating an OPC'ed cell block layout by configuring a cell block by using the OPC'ed cell layout; and generating an OPC'ed full-chip layout by configuring the full-chip by using the OPC'ed cell block layout.

12. The full-chip cell CD correction method of claim 11, wherein the generating and converting of the density map into the retarget rule table includes:

generating the density map;

converting the density map into a density polygon by filtering the density map by using set thresholds; and generating the retarget rule table by using the density polygon, wherein the density map is generated by performing convolution on a layout of a chip with a kernel.

13. The full-chip cell CD correction method of claim 11, wherein the generating and converting of the density map into the retarget rule table includes:

generating the density map; and generating the retarget rule table based on the density map, wherein the density map is generated by analyzing a space around a reference cell block.

14. The full-chip cell CD correction method of claim 11, wherein the generating of the OPC'ed layout for the full-chip includes generating the OPC'ed layout for the full-chip based on a CD error according to a position in an extreme ultraviolet (EUV) slit.

15. The full-chip cell CD correction method of claim 14, further comprising:

before the generating of the OPC'ed cell layout, calculating the CD error according to the position in the EUV slit with respect to the OPC target cell layout having the first bias applied thereto; and after the generating of the OPC'ed cell layout, applying a second bias to the OPC'ed cell layout according to the CD error according to the position in the EUV slit, wherein the generating of the OPC'ed cell block layout includes configuring the cell block by using the OPC'ed cell layout having the second bias applied thereto.

16. A method of manufacturing a mask, the method comprising:

receiving a database (DB) about a full-shot;

analyzing a hierarchy of the DB;

generating a density map of a full-chip by using the DB and converting the density map into a retarget rule table, the converting including mapping the density map using a density rule;

reconfiguring cell blocks of the full-chip into an optical proximity correction (OPC) target cell layout for OPC;

applying a first bias to the OPC target cell layout, based on the retarget rule table;

generating an optical proximity corrected (OPC'ed) layout for the full-chip by performing hierarchical OPC;

sending the OPC'ed layout for the full-chip as mask tape-out (MTO) design data;

preparing mask data based on the MTO design data; and exposing a mask substrate based on the mask data.

17. The method of claim 16, wherein the generating and converting of the density map into the retarget rule table includes:

generating the density map;

converting the density map into a density polygon by filtering the density map by using set thresholds; and generating the retarget rule table by using the density polygon, wherein the density map is generated by performing convolution on a layout of a chip with a kernel.

18. The method of claim 16, wherein the generating and converting of the density map into the retarget rule table includes:

generating the density map; and generating the retarget rule table based on the density map, wherein the density map is generated by analyzing a space around a reference cell block.

19. The method of claim 16, wherein the hierarchical OPC is performed through same processes as a hierarchical OPC is performed on a peripheral region and a core region, and the generating of the OPC'ed layout for the full-chip includes:

generating an OPC'ed cell layout by performing OPC on the OPC target cell layout having applied the first bias thereto;

generating an OPC'ed cell block layout by configuring a cell block by using the OPC'ed cell layout; and generating an OPC'ed full-chip layout by configuring the full-chip by using the OPC'ed cell block layout.

20. The method of claim 16, wherein the mask is an extreme ultraviolet (EUV) mask, and the generating of the OPC'ed layout for the full-chip includes generating the OPC'ed layout for the full-chip taking into account a critical dimension (CD) error according to a position in an EUV slit.

* * * * *